United States Patent
Kautzsch et al.

(10) Patent No.: US 9,330,929 B1
(45) Date of Patent: May 3, 2016

(54) SYSTEMS AND METHODS FOR HORIZONTAL INTEGRATION OF ACCELERATION SENSOR STRUCTURES

(71) Applicant: Infineon Technologies Dresden GmbH, Dresden (DE)

(72) Inventors: Thoralf Kautzsch, Dresden (DE); Heiko Fröhlich, Radebeul (DE); Mirko Vogt, Dresden (DE); Maik Stegemann, Pesterwitz (DE); Andre Röth, Dresden (DE); Steffen Bieselt, Wehlen (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 14/512,916

(22) Filed: Oct. 13, 2014

(51) Int. Cl.
| | |
|---|---|
| *H01L 29/84* | (2006.01) |
| *H01L 29/04* | (2006.01) |
| *H01L 29/66* | (2006.01) |
| *H01L 29/06* | (2006.01) |
| *H01L 21/3065* | (2006.01) |

(52) U.S. Cl.
    CPC .......... *H01L 21/3065* (2013.01); *H01L 29/84* (2013.01)

(58) Field of Classification Search
    CPC .. H01L 21/3065; H01L 29/84; B81C 1/00253
    USPC .............. 257/415, 49, 252, 416, 417, 618, 257/E21.499, E21.511; 438/50, 51; 381/91
    See application file for complete search history.

(56) References Cited

U.S. PATENT DOCUMENTS

| | | | | |
|---|---|---|---|---|
| 5,801,313 | A | * 9/1998 | Horibata | G01L 9/0073 361/283.4 |
| 6,151,967 | A | * 11/2000 | McIntosh | B81B 3/0086 361/283.4 |
| 2009/0255342 | A1 | * 10/2009 | Grudzien | G01L 9/0072 73/724 |
| 2011/0000303 | A1 | * 1/2011 | Fortner | G01L 9/0075 73/724 |
| 2011/0056302 | A1 | * 3/2011 | Lutz | G01L 9/12 73/724 |

* cited by examiner

*Primary Examiner* — Long K Tran
*Assistant Examiner* — Dzung Tran
(74) *Attorney, Agent, or Firm* — Eschweiler & Associates, LLC

(57) ABSTRACT

Embodiments relate to integrated circuit sensors, and more particularly to sensors integrated in an integrated circuit structure and methods for producing the sensors. In an embodiment, a sensor device comprises a substrate; a first trench in the substrate; a first moveable element suspended in the first trench by a first plurality of support elements spaced apart from one another and arranged at a perimeter of the first moveable element; and a first layer arranged on the substrate to seal the first trench, thereby providing a first cavity containing the first moveable element and the first plurality of support elements.

12 Claims, 9 Drawing Sheets

SYSTEMS AND METHODS FOR HORIZONTAL INTEGRATION OF ACCELERATION SENSOR STRUCTURES

TECHNICAL FIELD

The invention relates generally to integrated circuit sensors, and more particularly to sensors integrated in an application-specific integrated circuit (ASIC) structure and methods for producing the sensors, such as by encapsulation of the sensor between a metal layer and a stack with a dry-etchable sacrificial layer.

BACKGROUND

Sensors are commonly used in a variety of applications, including electronics, automotive and consumer goods, among others. Some types of sensors comprise a membrane, lamella or other suitable structure that flexes, deforms or otherwise moves in response to a physical quantity to be sensed or measured. One example of such a sensor is a pressure sensor, which can sense or measure pressure related to a gas, fluid, mechanical or other force. The flexure, deformation and/or movement of the moveable portion of the sensor (e.g., the membrane, lamella or other structure) can be sensed by a variety of technologies, including capacitive, piezoresistive, piezoelectric, electromagnetic, optical or some other technology, and the related pressure determined therefrom. For example, a pressure sensor can comprise a flexible membrane, typically 5-10 μm thick, that flexes or otherwise deforms when a pressure is present or when the structure is accelerated. The flexure of the membrane can be detected capacitively by an electrode arranged proximate the membrane, as a capacitance between the membrane and the electrode changes as the membrane sags or expands and thereby moves closer to or away from the electrode.

Regardless of type, sensors often operate as parts of larger systems and therefore may be integrated within these systems. In some applications, such as tire pressure sensors, a pressure sensor can be integrated within a Tire Pressure Monitoring System (TPMS). Other systems utilizing integrated pressure measurement systems include airbag Application-Specific Integrated Circuits (ASICs). As the processes for manufacturing TPMSs and ASICs develop and evolve, it can be challenging to integrate manufacture of the sensors with the ASIC without increasing the complexity of or having to alter the fundamental manufacturing processes. For example, many TPMSs and ASICs are constructed using CMOS (complementary metal-oxide-semiconductor) technologies, and integrating pressure sensor construction into suitable CMOS processes can be complicated and/or expensive, sometimes requiring changes to the conventional processing steps or techniques or requiring additional steps. For example, one attempt to integrate pressure sensor structure comprising a polycrystalline silicon lamella required at least five mask planes and a complicated process for removing the sacrificial layer between the lamella and the substrate to enable the lamella to flex or move, and it ultimately could not be successfully integrated in a CMOS process.

A need therefore remains for improved sensor structures.

SUMMARY

Embodiments relate to integrated circuit sensors, and more particularly to sensors integrated in an integrated circuit structure and methods for producing the sensors.

In an embodiment, a method of producing a sensor device comprises providing a substrate; forming a trench in the substrate; forming a sealing layer on the substrate to seal the trench and form a cavity, the cavity containing a moveable element and a plurality of support elements in a sacrificial layer, the plurality of support elements spaced apart from one another and arranged at a perimeter of the moveable element; and dry-etching the sacrificial layer in the cavity via at least one aperture in the sealing layer to release the moveable element within the trench.

In an embodiment, a sensor device comprises a substrate; a first trench in the substrate; a first moveable element suspended in the first trench by a first plurality of support elements spaced apart from one another and arranged at a perimeter of the first moveable element; and a first layer arranged on the substrate to seal the first trench, thereby providing a first cavity containing the first moveable element and the first plurality of support elements.

BRIEF DESCRIPTION OF THE DRAWINGS

The invention may be more completely understood in consideration of the following detailed description of various embodiments of the invention in connection with the accompanying drawings, in which.

Figure 1:
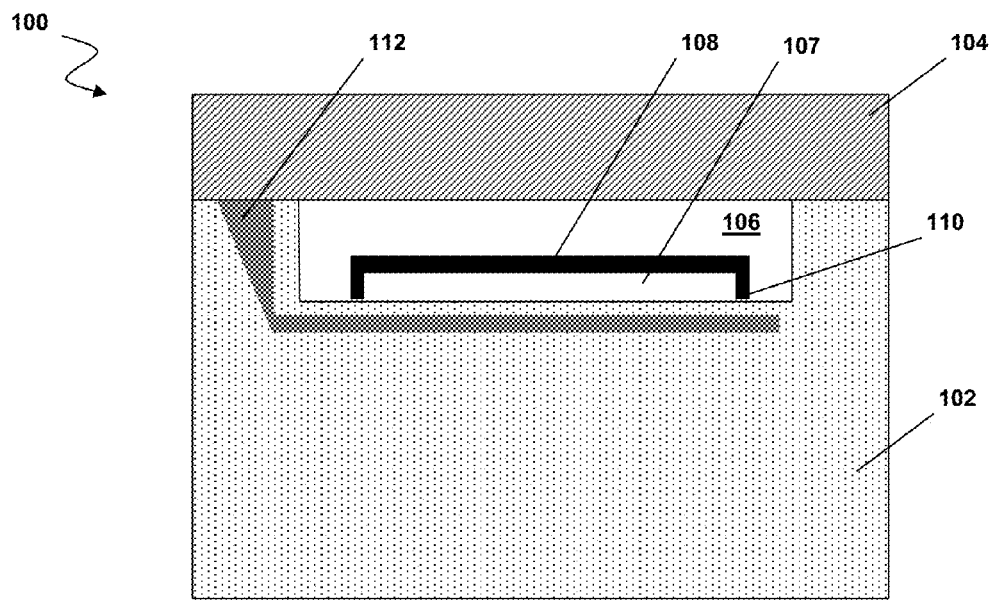
FIG. 1 is a side cross-sectional view of a sensor device according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to integrated circuit sensors, and more particularly to sensors integrated in an integrated circuit structure and methods for producing the sensors. In one embodiment, a sensor device can be integrated in an integrated circuit, such as an application-specific integrated circuit (ASIC), structure by encapsulation in a stack with an etchable sacrificial layer. In one embodiment the sacrificial layer is dry-etchable. In some embodiments, a sensor device can be integrated in a particular structure of the ASIC with another function, such as in a shallow trench isolation (STI) or other feature of the ASIC. Still other integration locations and methodologies can be used in other embodiments. The sensor device can comprise at least one of an acceleration sensor, a pressure sensor, and/or some other suitable sensor.

An integrated circuit is a set of electronic circuits and/or electronic circuit elements formed or arranged on a single chip of semiconductor material, such as comprising silicon. Integrated circuits can be very small in size yet comprise a multitude of circuits and circuit elements. Some integrated circuits are application-specific integrated circuits (ASICs), which are customized for a particular use or purpose. ASICs can comprise specialized circuits, circuit elements and programming features. Integrated circuits generally and ASICs in particular can comprise or be arranged in packages, generally referred to as integrated circuit packages. Integrated circuit packages can comprise a housing or structure to enclose and protect the circuitry, and leads or other elements (e.g., solder bumps, wires, etc.) to communicate signals to and from the integrated circuit in the package. Integrated circuit packages can be customized for the contents, such as an optical sensor integrated circuit package that comprises an aperture to enable light to reach a photosensitive portion of the sensor within the package.

Referring to FIG. 1, an integrated sensor device 100 is depicted. Sensor device 100 comprises a substrate 102, which can comprise silicon, silicon composites, or other materials in embodiments. In the examples discussed herein, substrate 102 generally comprises silicon unless otherwise mentioned, though these examples are not limiting with respect to other or all possible embodiments limited only by the scope of the claims.

The portion of substrate 102 depicted in the drawings can be part of a larger silicon wafer or can be singulated therefrom. In embodiments, substrate 102 can extend in any direction beyond the particular portion depicted in the drawings to comprise or be coupled with other structures formed in or on substrate 102. While substrate 102 is shown as part of an arrangement or "stack" of layers, layers other than those specifically depicted and discussed can be included in the stack in other embodiments, either above, below or within those depicted.

Sensor device 100 further comprises at least one sealing and/or encapsulation layer 104, a cavity 106 formed in substrate 102 and sealed or closed by layer 104, and a moveable element 108 encapsulated or otherwise disposed in cavity 106. Layer 104 can comprise a sealing layer, a metal layer, and/or other layer(s) of sensor device 100 formed on or over substrate 102, though in some embodiments layer 104 comprises a functional layer of device 100. For example, layer 104 can be conductive such that it can be used for read-out or other communication of signals related to movable element 108, or have some other function within sensor device 100 and/or a device of which sensor device 100 forms a part or is integrated with or in. Sealing or encapsulation per se need not be the primary or main function of layer 104, though it is referred to as such layer herein for ease of explanation. For example, layer 104 can comprise a first oxide or other sealing layer and a metal or other layer(s) thereover (refer, e.g., to FIGS. 8 and 9), which itself (or components thereof) forms other devices or features of an integrated circuit or a stack in combination with substrate 102, sensor device 100 or other components thereof, or still other devices or components not depicted. In other words, versatility can be an advantage of embodiments, in which the structures and principles discussed herein can be applied in many different devices and structures.

Cavity 106 is formed in substrate 102 and defined in part by layer 104. In embodiments, cavity 106 can be formed specifically to accommodate moveable element 108. In other embodiments, cavity 106 can have other functions while still accommodating moveable element 108. For example, in one embodiment cavity 106 comprises a shallow trench isolation (STI) structure. STI can be incorporated in integrated circuit devices to provide isolation between adjacent circuit elements or structures, preventing current leakage and other adverse effects. STI is often used in CMOS (complementary metal-oxide-semiconductor) technologies, and incorporation of the lamella in a CMOS STI structure can further streamline processing and provide sensor integration opportunities not otherwise available without significantly altering (and thereby making more complex and expensive) ordinary CMOS techniques. In other embodiments, cavity 106 can comprise some other trench or structure, whether formed solely to accommodate moveable element 108 or for some other additional purpose or function. Examples of methodologies for forming cavity 106 are discussed herein below.

Figure 2:
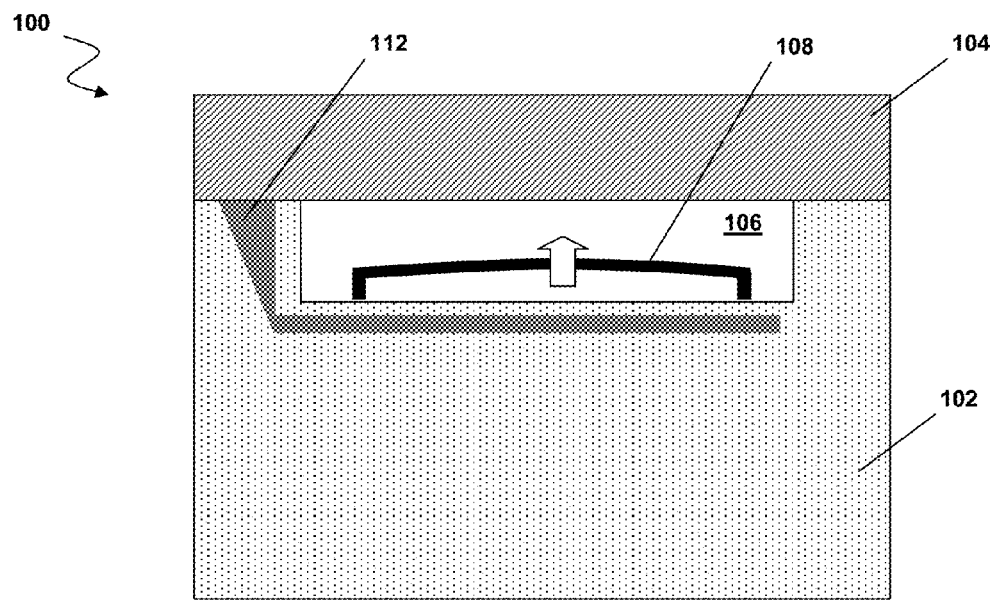
FIG. 2 is a side cross-sectional view of a sensor device according to an embodiment.
Figure 3:
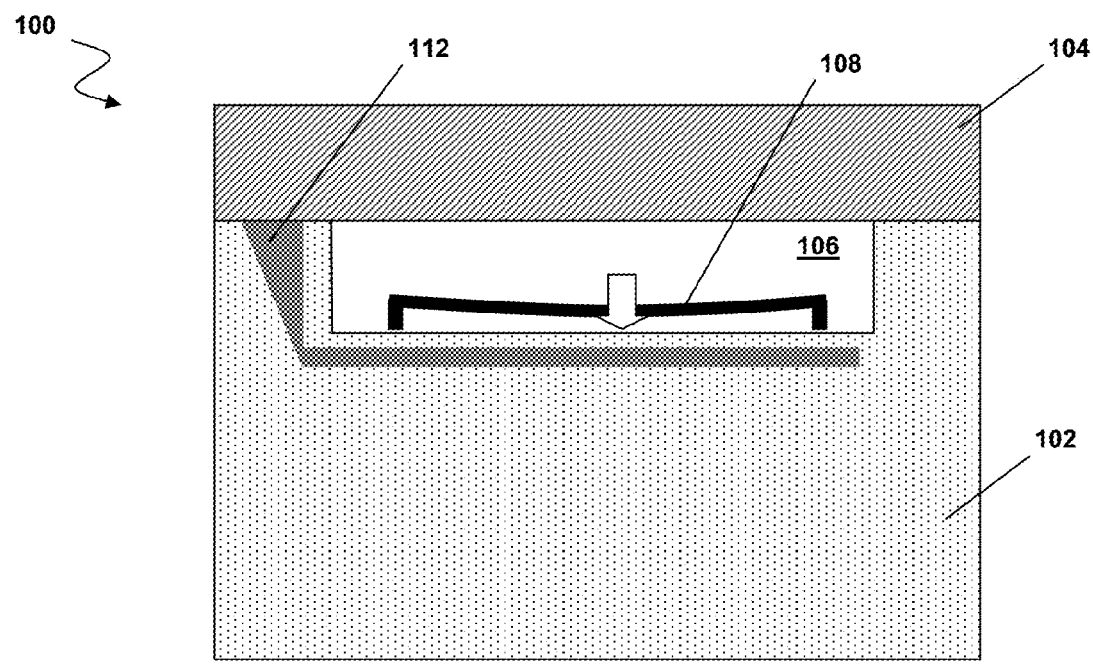
FIG. 3 is a side cross-sectional view of a sensor device according to an embodiment.

Moveable element 108 can comprise a lamella, a diaphragm or some other similar structure that moves or flexes upwardly (FIG. 2) and/or downwardly (FIG. 3) when acted on by a physical characteristic such as pressure or acceleration. The movement or flexure of moveable element 108 can be sensed capacitively, piezoelectrically, piezoresistively, electromagnetically, optically or via some other technology in various embodiments. Moveable element 108 can comprise silicon, polysilicon or some other suitable material or composite of materials in embodiments.

In embodiments, moveable element 108 is generally square, with lateral dimensions of about 5 μm to about 200 μm, such as about 5 μm to about 20 μm (e.g., the width of moveable element 108 is about 10 μm and the length—the dimension into the drawing page—is about 10 μm in one example embodiment), and a thickness of less than about 500 nm, such as about 100 nm to about 500 nm, or about 250 nm to about 350 nm, such as about 300 nm in one embodiment. A size-related characteristic of moveable element 108 is the ratio of the maximum deflection to the average deflection in operation. In general, and for reasons relating to linearity and the production of sensor device 100 (i.e., the formation of cavity 106), the maximum deflection should not exceed about 10 percent of the height of cavity 106, which can lead to a larger and thicker moveable element 108 that is undesirable because of size limitations and cost constraints. The average deflection, on the other hand, is related to the sensor signal (e.g., capacitive). A configuration in which the ratio of maximum deflection to average deflection is as small as possible therefore can be advantageous.

Figure 4:
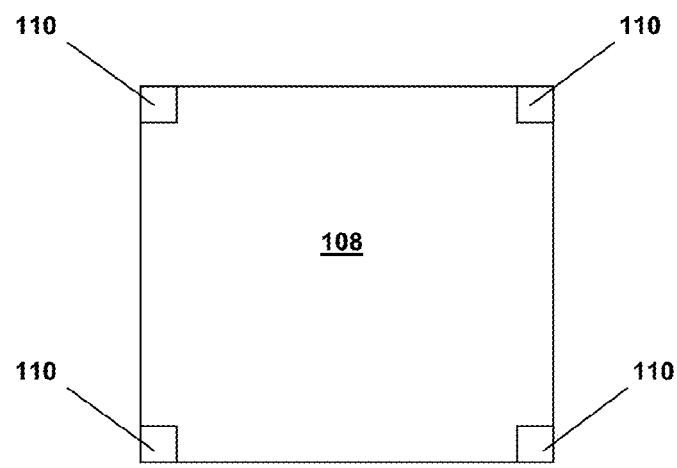
FIG. 4 is a top, partially transparent view of a lamella and support elements according to an embodiment.
Figure 5:
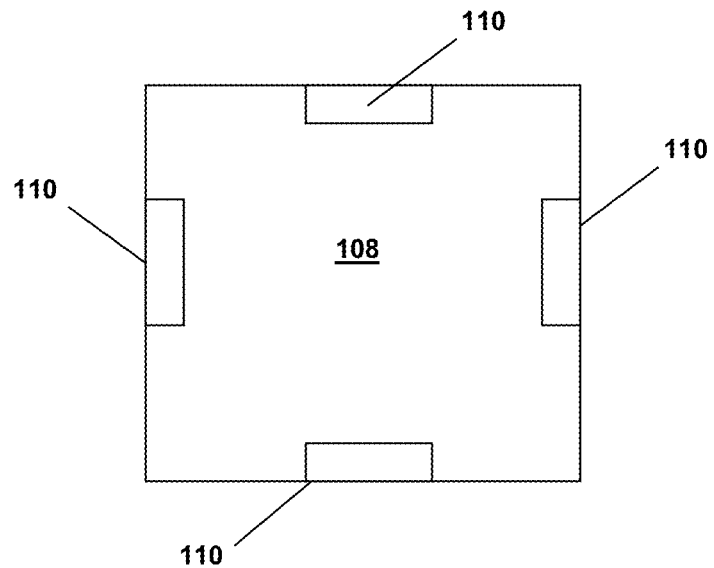
FIG. 5 is a top, partially transparent view of a lamella and support elements according to an embodiment.
Figure 6:
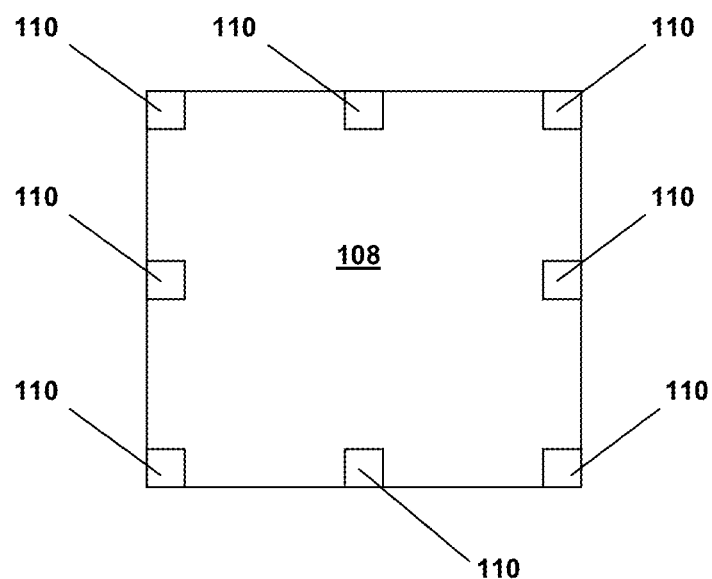
FIG. 6 is a top, partially transparent view of a lamella and support elements according to an embodiment.
Figure 7:
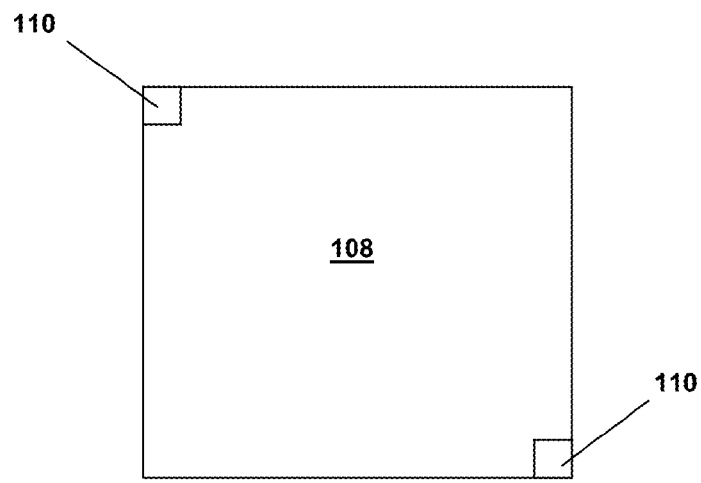
FIG. 7 is a top, partially transparent view of a lamella and support elements according to an embodiment.
Figure 8A:
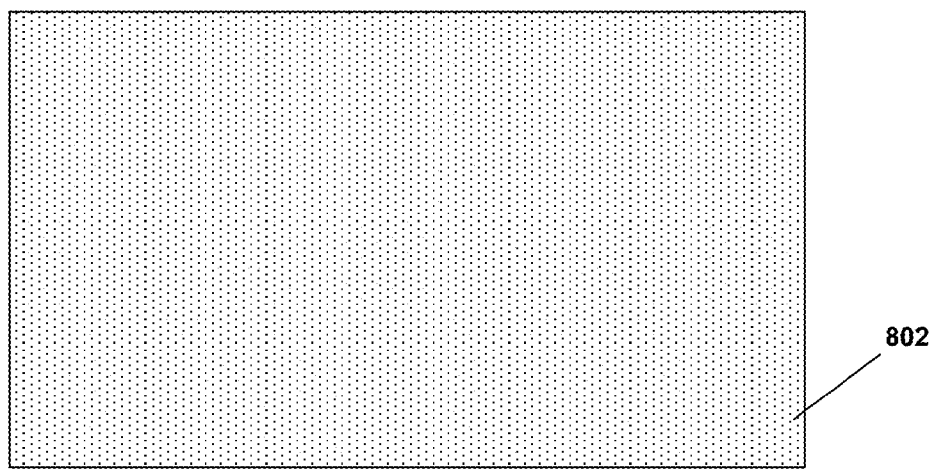
FIG. 8A is a side cross-sectional view of a manufacturing stage of a sensor device according to an embodiment.
Figure 8B:
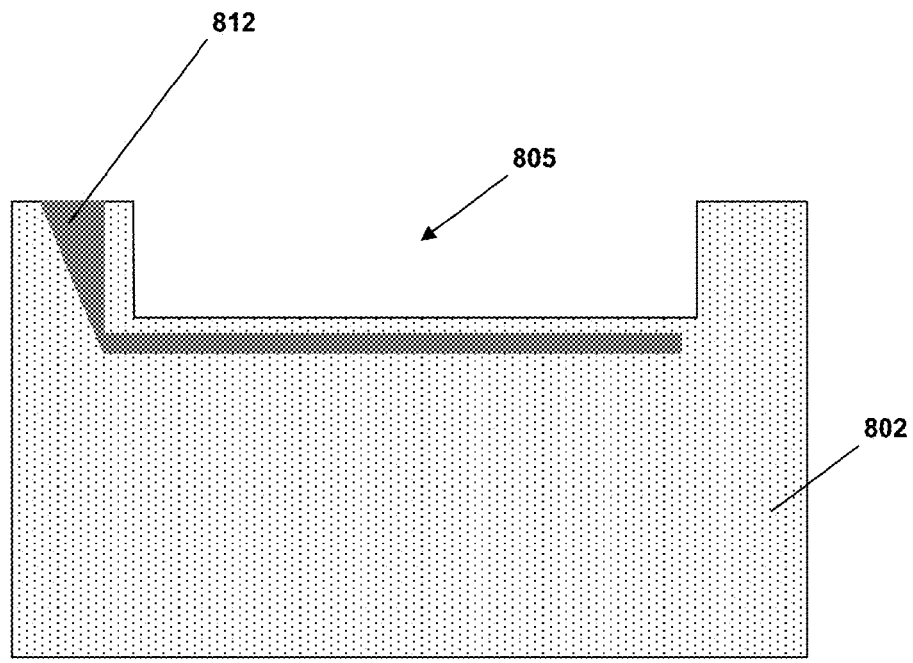
FIG. 8B is a side cross-sectional view of a manufacturing stage of a sensor device according to an embodiment.
Figure 8C:
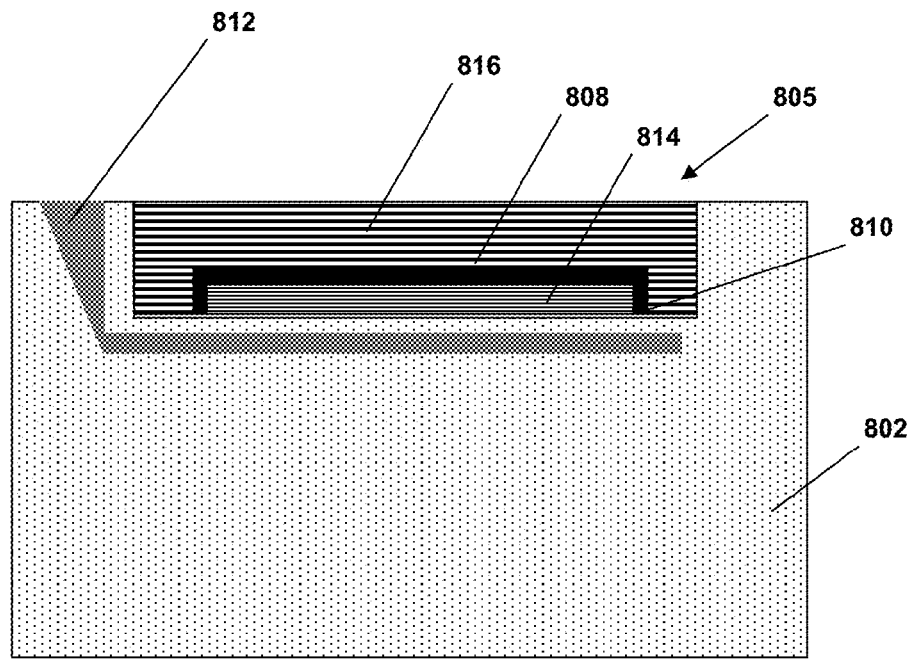
FIG. 8C is a side cross-sectional view of a manufacturing stage of a sensor device according to an embodiment.
Figure 8D:
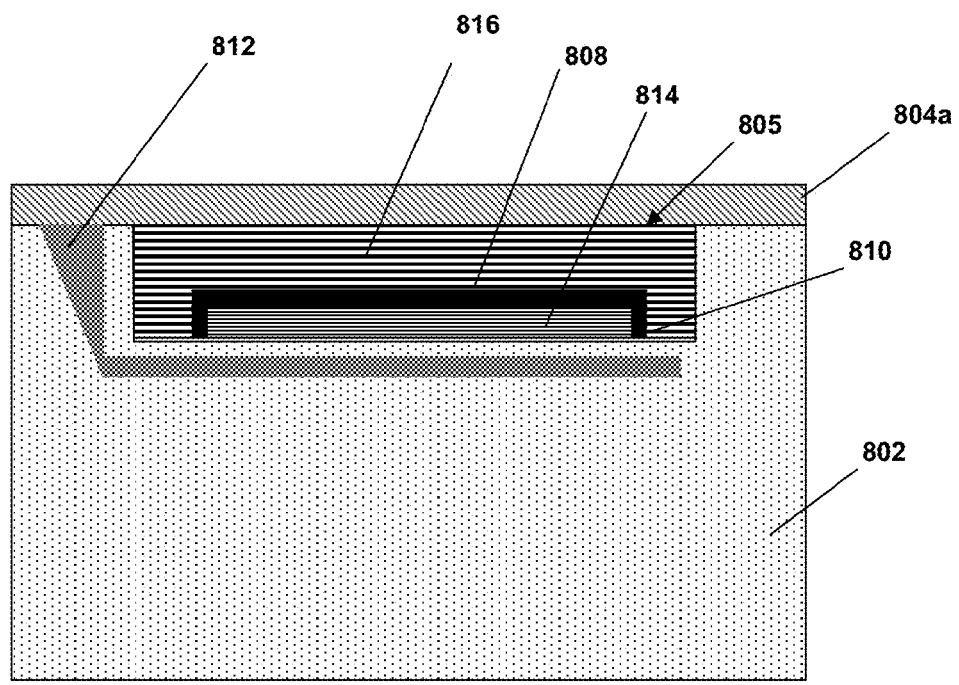
FIG. 8D is a side cross-sectional view of a manufacturing stage of a sensor device according to an embodiment.
Figure 8E:
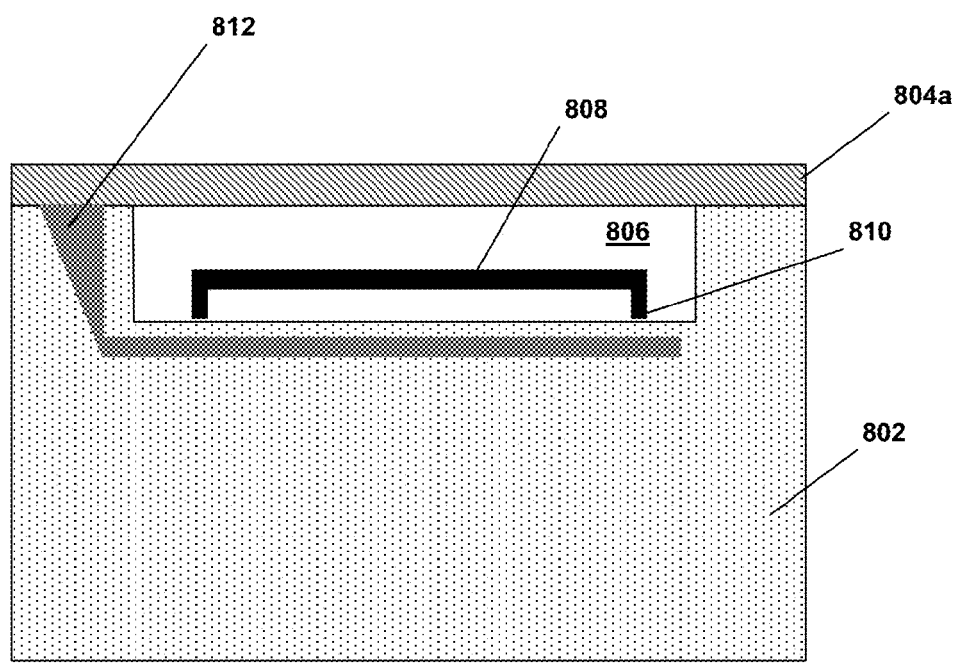
FIG. 8E is a side cross-sectional view of a manufacturing stage of a sensor device according to an embodiment.
Figure 8F:
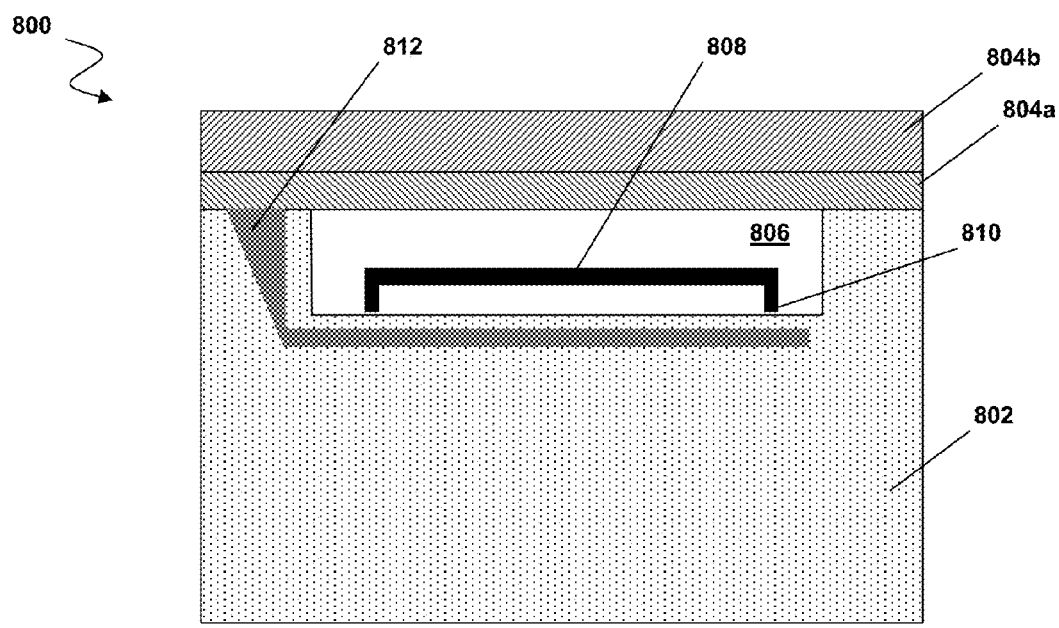
FIG. 8F is a side cross-sectional view of a manufacturing stage of a sensor device according to an embodiment.

Moveable element 108 comprises or is coupled to a plurality of support elements 110, such as at least two support elements 110 in embodiments. In one embodiment depicted in FIG. 4, moveable element 108 is substantially square, with a support element 110 located at each corner of the square. In other embodiments, the support elements 110 can be located along the sides rather than at the corners, as in FIG. 5. In another embodiment, a single support element 110 is used along part or all of a single side of moveable element 108. In still other embodiments, support elements 110 can be located at the corners and sides as depicted in FIG. 6, or at only some corners or sides, symmetrically or asymmetrically. For example, in one embodiment two support elements 110 are located at diagonally opposing corners as depicted in FIG. 7, which can enable moveable element 110 to tilt instead of or in addition to flexing up and down. While support elements 110 are depicted as being the same size and shape in embodiments, support elements can be differently sized or shaped in various embodiments and/or with respect to one another in any particular embodiment. For example, in one embodiment support elements 110 can comprise spring-like structures, among others. Additionally, while moveable element is depicted as being substantially square, it can have virtually any shape (e.g., round, rectangular, oblong, triangular or some other multi-sided shape), and the arrangement, size and configuration of support elements 110 can be selected in accordance with the arrangement, size and configuration of the moveable element they support. For example, in one embodiment each support element 110 is generally square-shaped and has a lateral dimension of less than about 3,000 nm, such as lateral dimensions of about 500 nm by 500 nm and a height of about 20 nm to about 400 nm, though support elements 110 can be larger or smaller and/or have some other shape (e.g., round, triangular, oval, rectangular, hexagonal, some other single- or multi-sided shape, etc.) in other embodiments. For example, in one embodiment moveable element 108 is triangularly shaped and comprises three support elements 110. A sub-cavity 107 separates and is defined by substrate 102 and moveable element 108. The height of support elements 110 defines the height of sub-cavity 107 (i.e., the distance between a bottom surface of moveable element 108 and a top surface of substrate 102), and the height can be in a range of about 20 nm to about 200 nm in some embodiments.

As understood by those skilled in the art, the particular dimensions of moveable element 110 and the dimensions and arrangement of support elements 110 can be varied to adjust or modulate the deflection of moveable element 110. Thereby, the various geometries of sensor device 100 can be chosen to enable sensor device 100 to function as one of many different types of sensor devices, such as an acceleration sensor with moveable element 110 comprising a mass element. In simulations, even accelerations of less than about 0.1 G can be sensed capacitively by sensor device 100. For example, in an embodiment in which sensor device 100 comprises an acceleration sensor, the following simulations were obtained:

Sensor Device A
Moveable element lateral dimension: 100 μm
Moveable element thickness: 300 nm
Support element width: 1 μm
Support element length: 10 μm
Acceleration: 30 G
Flexure (max): 1.90 nm
Sensor Device B
Moveable element lateral dimension: 100 μm
Moveable element thickness: 300 nm
Support element width: 1 μm
Support element length: 5 μm
Acceleration: 30 G
Flexure (max): 1.44 nm
Sensor Device C
Moveable element lateral dimension: 100 μm
Moveable element thickness: 300 nm
Support element width: 1 μm
Support element length: 1 μm
Acceleration: 30 G
Flexure (max): 1.05 nm In embodiments, sensor device 100 can comprise additional components and features. For example, sensor device 100 can comprise at least one electrode or other structure on one or both of a bottom or top surface of cavity 106 (wherein the top surface of cavity 106 generally refers to an underside surface of layer 104) or within layer 104 or substrate 102. Such an electrode can be used in embodiments in which moveable element 108 forms part of a capacitive sensor, with a voltage between the electrode and moveable element 108 being measured to sense flexure of moveable element 108 in an up or down direction (with respect to the orientation of the drawings on the page) in operation, where that flexure changes a capacitance between moveable element 108 and the electrode. As previously mentioned, in embodiments layer 104 can be conductive or comprise at least one conductive portion such that it can be used for read-out or other communication of signals related to movable element 108. As such, sensor device 100 could provide a differential output signal, such as in an embodiment in which sensor device 100 is used in a force-feedback mode. In a force-feedback mode, a DC bias can be used to compensate acceleration forces such that moveable element 108 does not move. Embodiments of sensor device 100 can be advantageous for this type of operation since sensor device 100, or at least moveable element 108 thereof, can be much lighter (e.g., have less mass) than conventional seismic masses.

Sensor device 100 also can comprise additional isolation structures or layers, and/or highly-doped regions such as region 112. In one embodiment, region 112 can be used for capacitive read-out of signals from moveable element 108, such as in conjunction with layer 104, or other functions. Additionally, sensor device 100 can comprise or be coupled with circuitry to, e.g., receive signals from moveable element 108 and/or electrodes or other components associated therewith, provide voltage or current thereto, and carry out various other functions related to the operation of sensor device 100.

In operation, an estimation of a sensor signal of sensor device 100 can be as follows:

$$p_{acc} = \delta_{Si} da = 0.023 \frac{d}{[\mu m]} \frac{a}{[g]}$$

In this case, the flexure of moveable element 108 caused by an acceleration acting thereon can be equated with a pressure $p_{acc}$ that causes an identical flexure. $\delta_{Si}$ is the specific mass of silicon (or another material of lamella 108 in other embodiments), d is the thickness of moveable element 108, and a is the acceleration. Thus, a conventional diaphragm fixed on all sides having a thickness of 300 nm and an edge length or lateral dimension of 10 μm would have a maximum deflection of 3.5 nm at one bar, and a deflection of approximately 2.6e-16 m at 10 m/s². This value, however, is so small as to be barely measurable. In an embodiment of sensor device 100, with a moveable element 108 and support elements 110 as discussed herein, the value increases to 2.6e-12 m or 0.026 Å. Although this value is only ½₀ of the Bohr radius, it is in the resolution range of good sensors, and a significant improvement with respect to conventional devices.

Some applications of sensor device 100 can be automotive, such as in a side airbag sensor or tire pressure monitoring system (TPMS). For example, a passenger vehicle tire has an acceleration of approximately 30 G at the tire air valve at 30 km/h (a=v²/r; r≈0.3 m), which brings about a maximum deflection of approximately 0.7 Å for a moveable element 108 with a lateral dimension of 100 μm. If the dimensioning of the suspension by support elements 110 is very narrow, the deflection of lamella 108 increases accordingly.

Figure 9:
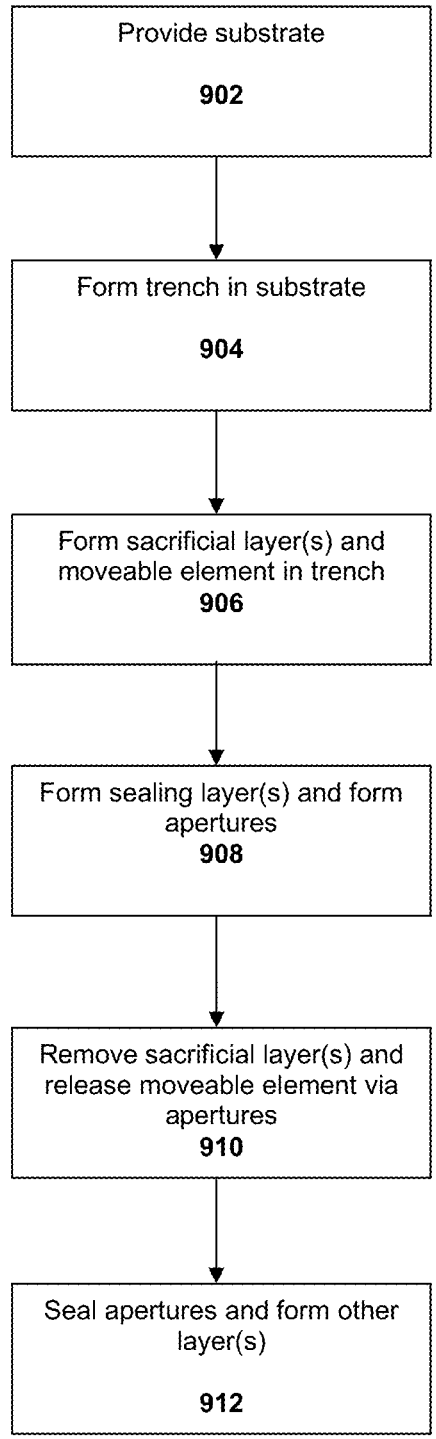
FIG. 9 is a flowchart of a method of manufacturing a sensor device according to an embodiment.

An advantage of embodiments, as previously mentioned, is easier integration in existing manufacturing processes, such as CMOS. Referring to FIGS. 8 and 9, at 902 (FIG. 8A) a substrate 802 is provided. Substrate 802 can comprise silicon, a composite thereof, or some other suitable material as discussed herein above. In one embodiment, substrate 802 comprises a silicon wafer. At 904 (FIG. 8B), a well or trench 805 is formed in substrate 802, such as by using a patterning photolithography process. Optionally, an isolation structure 812 is also formed in substrate 802. At 906 (FIG. 8C), a first sacrificial layer 814, moveable element 806 and support elements 810, and a second sacrificial layer 816 are formed in trench 805. At 908 (FIG. 8D), a sealing layer 804a is deposited. In embodiments, sealing layer 804a can comprise oxide, nitride, polysilicon, or some other suitable material or composition of these materials and/or others. Apertures can be formed in sealing layer 804a as or after it is deposited, such that, at 910 (FIG. 8E) first and second sacrificial layers 814 and 816 are removed via the apertures, such as by a dry-etch process or other process suitable according to the material composition of sacrificial layers 814 and 816 (e.g., carbon). In one embodiment, both sacrificial layers 814 and 816 can be dry-etchable, while in other embodiments only one layer 814 or 816 (e.g., sacrificial layer 814) is dry-etchable. This releases moveable element 808 within cavity 806. The use of a dry-etchable sacrificial layer enables thinner moveable elements 808 to be formed without the moveable element 808 being damaged or sticking to other surfaces, such as the bottom surface of trench 805 (cavity 806). In embodiments, moveable element 808 is released at the sides or the corners by apertures to remove sacrificial layer 814 underneath. In this way, the lithography process for patterning moveable element 808 also can be used for aperture formation. Additionally, the apertures can be closed without needing to retain the open portion of trench 805 below the apertures, which are instead located at the sides or corners. Moveable element 806 now can flex and move within cavity 806. Thus, at 912 (FIG. 8F), the apertures can be closed, and additional encapsulation or layer(s) 804b can be formed on substrate 802 (e.g., over sealing layer 804a or a portion thereof). In an embodiment, the apertures can be closed by depositing a non-conformal or other layer, such as a non-conformal layer comprising HDP oxide or another suitable material or composition of materials. Layer 804b can comprise metallization and/or other layers, such as those commonly formed in backend processing. Additional processes and structures can be formed after, before or intermediate to any of those discussed herein in various embodiments.

Figure 10:
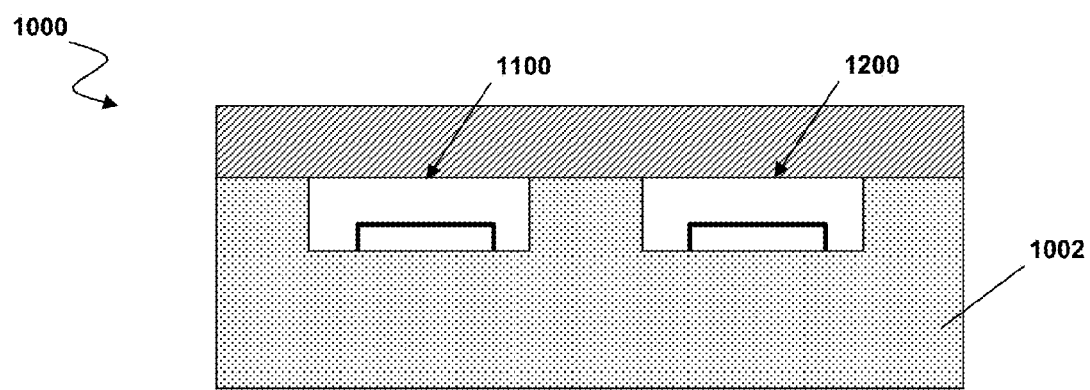
FIG. 10 is a side cross-sectional view of a device comprising a plurality of sensor devices according to an embodiment.

For example, referring to FIG. 10, in embodiments a sensor device 1000 can comprise a plurality of integrated sensor devices, such as an acceleration sensor device 1100 integrated with a pressure sensor device 1200 formed in the same substrate 1002. The methods discussed herein enable easier integration of multiple sensor devices in a single, overarching device in which the sensor devices operate together. In still other embodiments, a single cavity (e.g., cavity 106 in FIG. 1) can contain a plurality or array of lamellas 108. Still other integration options can be implemented in other embodiments, given the improved manufacturability and other features of embodiments.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A method of producing a sensor device comprising:
   providing a substrate;
   forming a trench in the substrate;
   forming a sealing layer on the substrate to seal the trench and form a cavity, the cavity containing a moveable element and a plurality of support elements in a sacrificial layer, the plurality of support elements spaced apart from one another and arranged at a perimeter of the moveable element; and
   dry-etching the sacrificial layer in the cavity via at least one aperture in the sealing layer to release the moveable element within the trench.

2. The method of claim 1, wherein forming the trench comprises forming a shallow-trench isolation (STI) element.

3. The method of claim 1, wherein dry-etching the sacrificial layer further comprises removing the sacrificial layer above and below the moveable element within the trench.

4. The method of claim 1, wherein forming a sealing layer further comprises forming at least one aperture in the sealing layer.

5. The method of claim 1, further comprising forming the moveable element to have a thickness of less than about 500 nanometers (nm).

6. The method of claim 5, further comprising forming the moveable element to have a thickness of about 300 nm.

7. The method of claim 6, further comprising forming the plurality of support elements to have a lateral dimension less than about 10 micrometers (μm).

8. The method of claim 1, further comprising forming the plurality of support elements at at least two corners of the moveable element.

9. The method of claim 1, further comprising forming the plurality of support elements along at least two edges of the moveable element.

10. The method of claim 1, further comprising patterning the moveable element and at least one aperture for the dry etching in the same process.

11. The method of claim 10, further comprising closing the at least one aperture.

12. The method of claim 1, further comprising forming integrated first and second sensor devices on the substrate by forming at least two trenches, and using the forming the sealing layer and the dry-etching in both of the at least two trenches.

* * * * *